(12) United States Patent
Iwase

(10) Patent No.: US 10,595,402 B2
(45) Date of Patent: Mar. 17, 2020

(54) STRETCHABLE CIRCUIT BOARD AND STRETCHABLE CIRCUIT BOARD MANUFACTURING METHOD

(71) Applicant: NIPPON MEKTRON, LTD., Tokyo (JP)

(72) Inventor: Masayuki Iwase, Tokyo (JP)

(73) Assignee: NIPPON MEKTRON, LTD., Tokyo (JP)

(*) Notice: Subject to any disclaimer, the term of this patent is extended or adjusted under 35 U.S.C. 154(b) by 0 days.

(21) Appl. No.: 16/188,513

(22) Filed: Nov. 13, 2018

(65) Prior Publication Data
US 2019/0166688 A1    May 30, 2019

(30) Foreign Application Priority Data
Nov. 27, 2017  (JP) .................. 2017-227135

(51) Int. Cl.
| | |
|---|---|
| H05K 1/00 | (2006.01) |
| H05K 1/02 | (2006.01) |
| H05K 1/03 | (2006.01) |
| H05K 1/11 | (2006.01) |
| H05K 1/18 | (2006.01) |
| H05K 3/00 | (2006.01) |
| H05K 3/06 | (2006.01) |
| H05K 3/20 | (2006.01) |
| H05K 3/28 | (2006.01) |
| H05K 3/36 | (2006.01) |
| H05K 3/40 | (2006.01) |

(Continued)

(52) U.S. Cl.
CPC ......... *H05K 1/0283* (2013.01); *H05K 1/0393* (2013.01); *H05K 1/092* (2013.01); *H05K 1/147* (2013.01); *H05K 2201/0133* (2013.01); *H05K 2201/2009* (2013.01)

(58) Field of Classification Search
CPC .. H05K 1/00; H05K 1/02; H05K 1/03; H05K 1/11; H05K 1/18; H05K 3/00; H05K 3/03; H05K 3/06; H05K 3/28; H05K 3/36; H05K 3/40; H05K 3/46; H05K 3/20
USPC .......... 174/254–256, 259, 261; 361/749; 1/1
See application file for complete search history.

(56) References Cited

U.S. PATENT DOCUMENTS 5,144,534 A * 9/1992 Kober .................. H05K 3/4691
174/254
5,733,598 A * 3/1998 Sera ....................... H05K 1/189
427/405

(Continued)

FOREIGN PATENT DOCUMENTS

JP       2017-034038 A      2/2017

*Primary Examiner* — Xiaoliang Chen
(74) *Attorney, Agent, or Firm* — Studebaker & Brackett PC

(57) ABSTRACT

Provided is a stretchable circuit board including: a stretchable base material having stretchability; a film base material overlapping with part of a one-surface-side surface of the stretchable base material and having lower stretchability than that of the stretchable base material; a stretchable wiring line formed on the one-surface-side surface of the stretchable base material; and an adhesive layer formed on one surface side or the other surface side of the stretchable base material. The adhesive layer is formed on both of an overlapping region where the stretchable base material overlaps with the film base material and a non-overlapping region where the stretchable base material does not overlap with the film base material.

14 Claims, 7 Drawing Sheets

(51) Int. Cl.
*H05K 3/46* (2006.01)
*H05K 1/14* (2006.01)
*H05K 1/09* (2006.01)

(56) References Cited

U.S. PATENT DOCUMENTS

| | | | | |
|---|---|---|---|---|
| 6,362,433 | B1* | 3/2002 | Takahashi | H05K 1/0346 |
| | | | | 174/255 |
| 7,696,441 | B2* | 4/2010 | Kataoka | H05K 1/028 |
| | | | | 174/254 |
| 9,119,302 | B2* | 8/2015 | Hattori | H05K 3/4092 |
| 9,155,203 | B2* | 10/2015 | Happoya | H05K 3/022 |
| 9,896,546 | B2* | 2/2018 | Shimoda | B32B 27/281 |
| 9,960,512 | B2* | 5/2018 | Kato | H05K 1/147 |
| 10,034,370 | B2* | 7/2018 | Iwase | A61B 5/6801 |
| 10,194,527 | B2* | 1/2019 | Iwase | H05K 1/0283 |
| 2017/0034907 | A1* | 2/2017 | Iwase | H05K 1/0283 |
| 2018/0092206 | A1* | 3/2018 | Iwase | A61B 5/6801 |

* cited by examiner

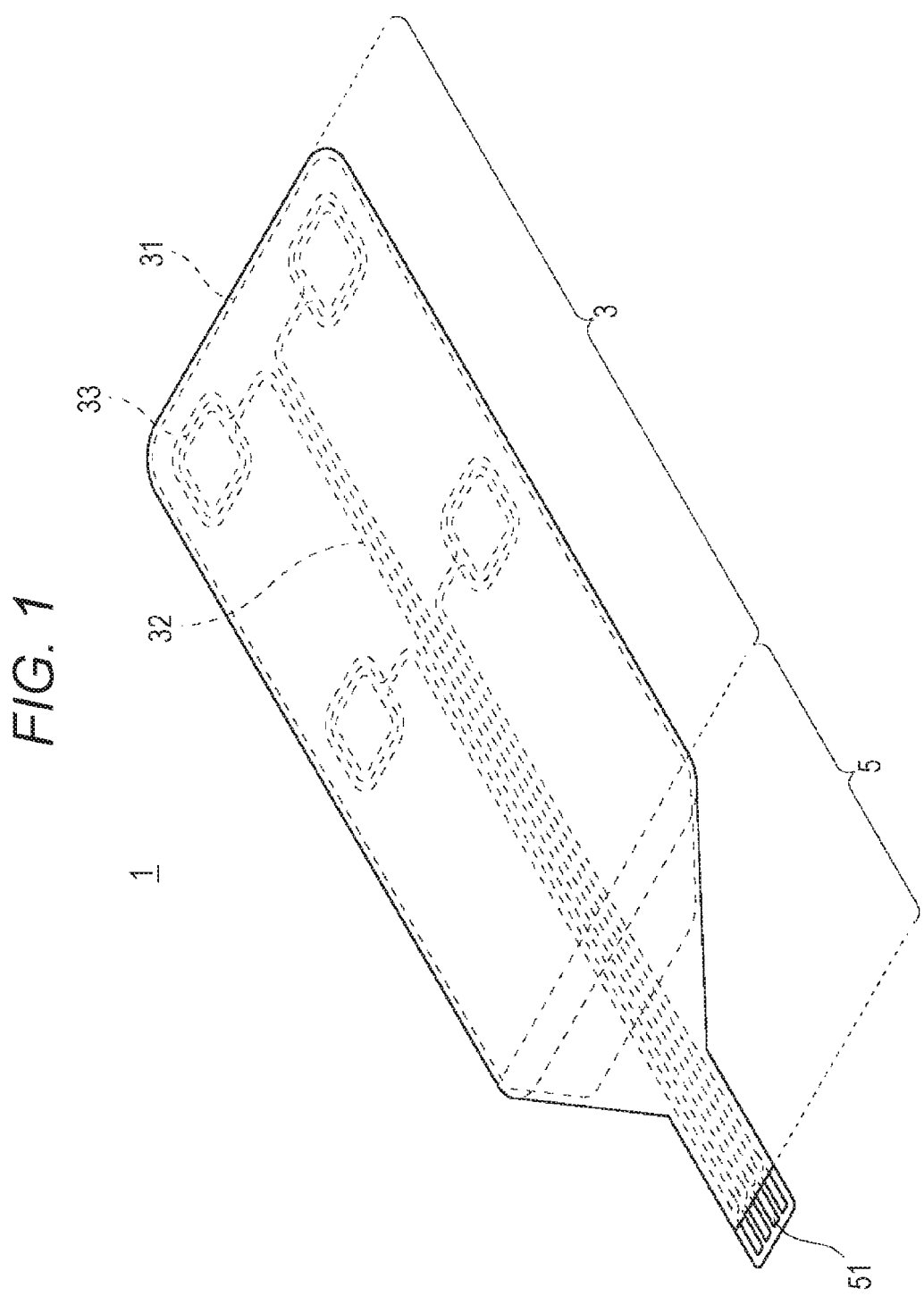

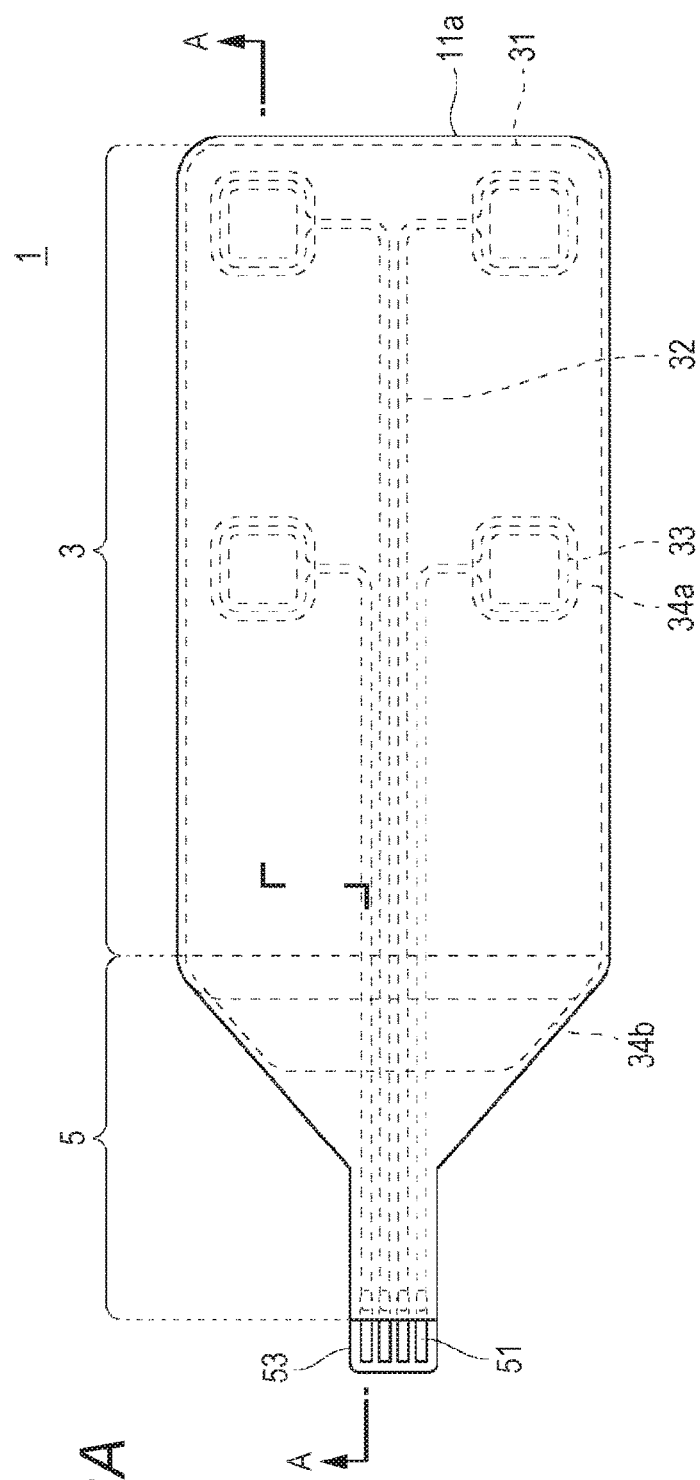
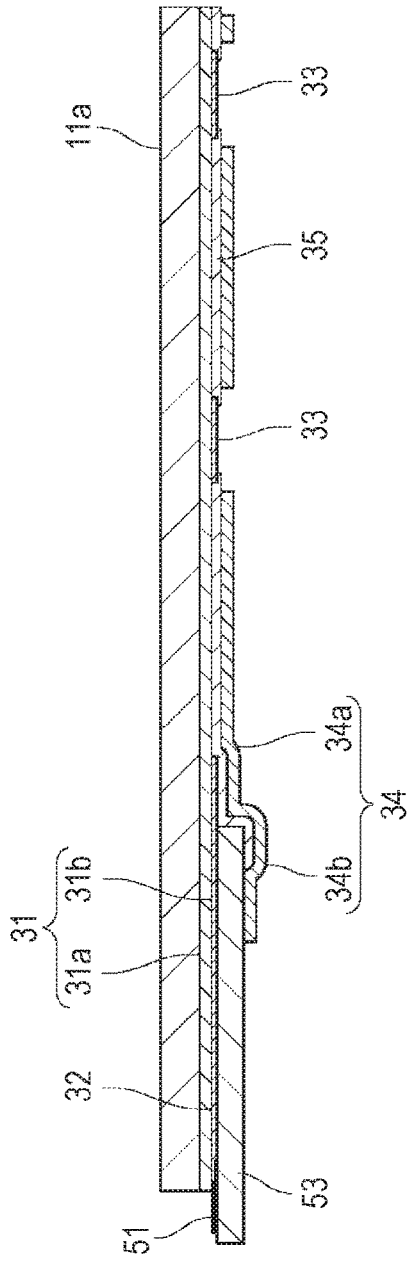
FIG. 2A
FIG. 2B

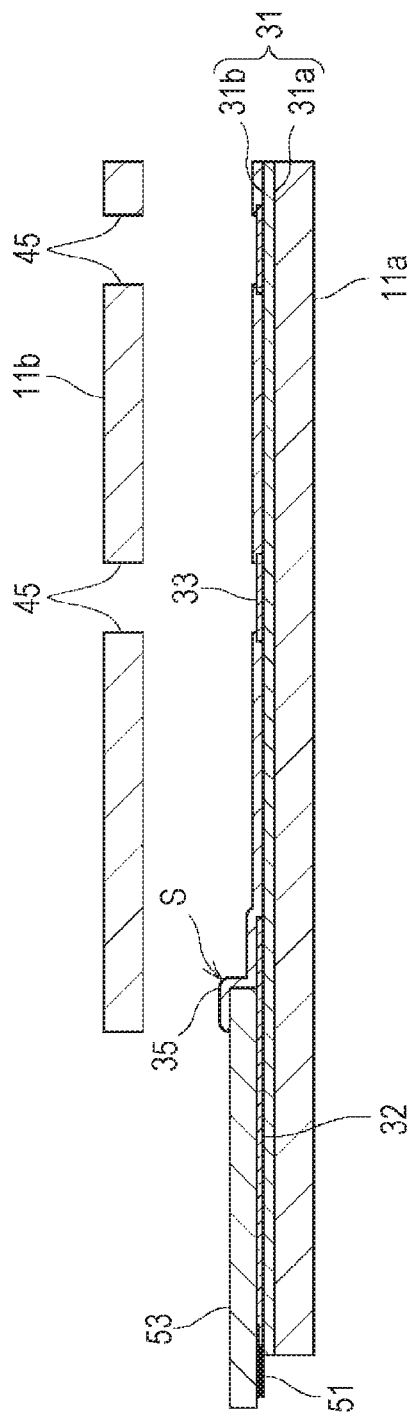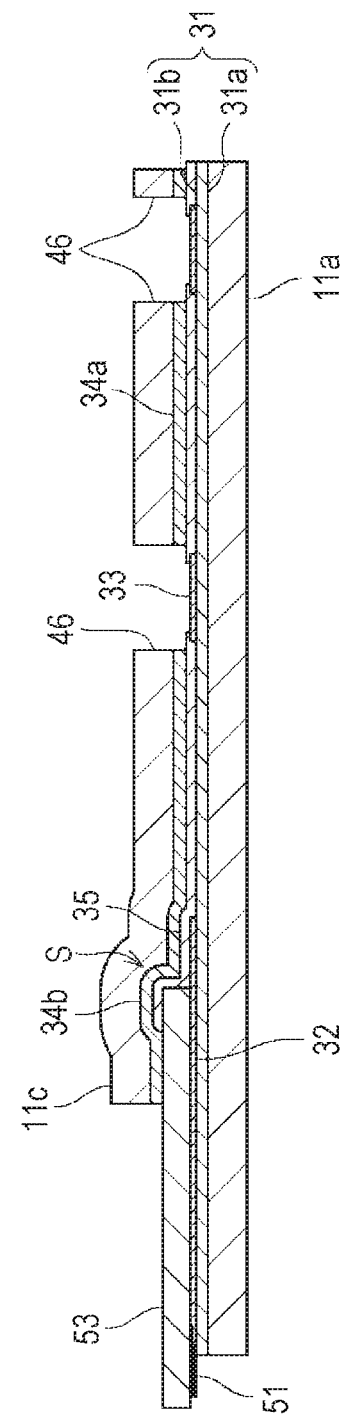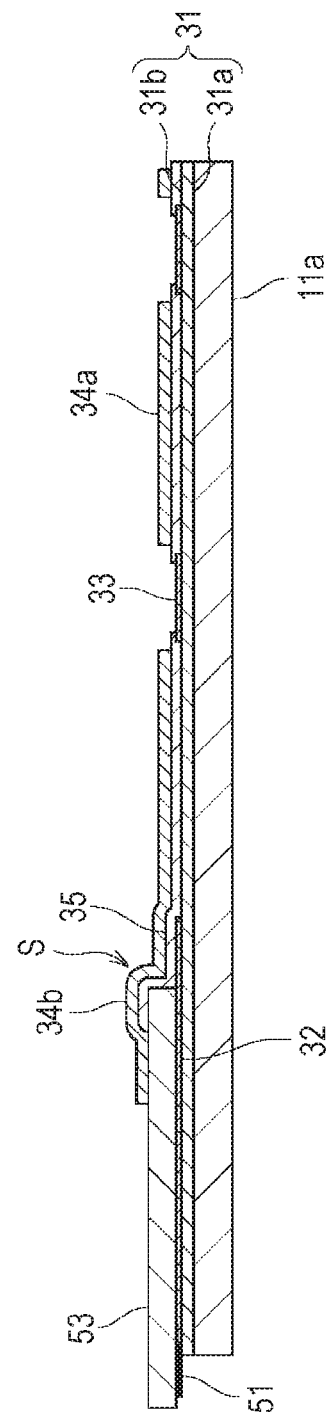

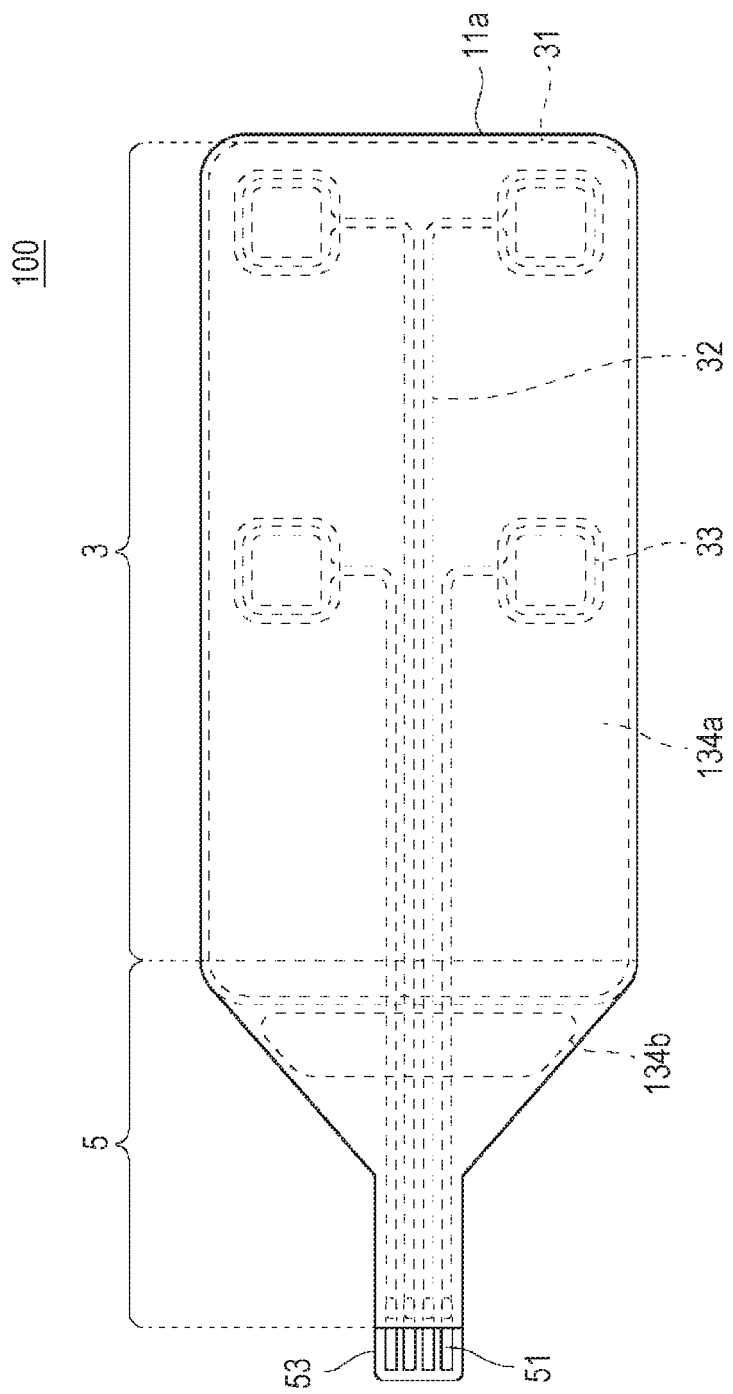

STRETCHABLE CIRCUIT BOARD AND STRETCHABLE CIRCUIT BOARD MANUFACTURING METHOD

CROSS-REFERENCE TO RELATED APPLICATION

This application claims priority from Japanese Patent Application No. 2017-227135 filed with the Japan Patent Office on Nov. 27, 2017, the entire content of which is hereby incorporated by reference.

BACKGROUND

1. Technical Field

The present disclosure relates to a stretchable circuit board having stretchability and a method for manufacturing the stretchable circuit board.

2. Related Art

Recently, in the market of wearable devices and medical devices, interest in biosensors and bio-information monitors has been grown. For example, in the field of sports, an attempt has been made to quantify body motion with high accuracy for more improvement in physical performance and technique of an athlete. In this case, a wearable biosensor configured to sense motion of a living body might be applied. Moreover, in a medical field, an attempt has been made to detect vital signs (bio-information) such as an electrocardiogram, a heart rate, a blood pressure, and a body temperature for treatment of diseases and prevention of presymptomatic diseases. In this case, the bio-information monitor configured to sense the bio-information might be applied.

In the above-described fields, a biosensor which can be used with the biosensor being directly attached to a living body as an information acquisition target has been demanded. The biosensor attachable to the living body does not interfere with activity of the target during bio-information monitoring. Thus, the bio-information can be acquired in a natural state. The biosensor attachable to the living body can be attached to the living body, and can be realized by a substrate having an electrode configured to detect a biosignal and a wiring line, for example. The substrate to be attached to the living body is preferably stretchable in association with stretching of a living body surface. For example, a stretchable circuit board disclosed in JP-A-2017-34038 is well-known as the above-described stretchable circuit board.

The stretchable circuit board described in JP-A-2017-34038 includes a stretchable base material stretchable together with the skin. Moreover, the stretchable circuit board includes an external terminal for outputting a detected electric signal to the outside. A region where the external terminal is formed by a (hard) base material having lower stretchability than that of the stretchable base material. At a boundary between the stretchable base material and the hard base material, stretchability of the stretchable circuit board greatly changes. In many cases, attachment of the stretchable circuit board to the living body is performed by a person (hereinafter referred to as a "target") targeted for bio-information monitoring. The target first detaches the stretchable circuit board from a cover film or a mount. Then, the target attaches the stretchable base material to the body of the target oneself while applying proper tension to the stretchable base material not to cause wrinkling of the stretchable base material. Moreover, for attaching the external terminal to, e.g., an element connector, the target performs, for example, the operation of bending an external terminal formation region in an upper-to-lower direction. By such operation, a stretching behavior of about 20% is applied to the stretchable circuit board. It has been known that disconnection of the wiring line formed across the stretchable base material and the hard base material is caused accordingly. JP-A-2017-34038 discloses that a stretchable auxiliary material for slowing a stretchability change is provided in a region including the boundary between the stretchable base material and the hard base material to prevent wire disconnection at the boundary.

SUMMARY

A stretchable circuit board according to an embodiment of the present disclosure includes: a stretchable base material having stretchability; a film base material overlapping with part of a one-surface-side surface of the stretchable base material and having lower stretchability than that of the stretchable base material; a stretchable wiring line formed on the one-surface-side surface of the stretchable base material; and an adhesive layer formed on one surface side or the other surface side of the stretchable base material. The adhesive layer is formed on both of an overlapping region where the stretchable base material overlaps with the film base material and a non-overlapping region where the stretchable base material does not overlap with the film base material.

BRIEF DESCRIPTION OF THE DRAWINGS

FIG. 1 is a perspective view of a state in which a stretchable circuit board of a first embodiment of the present disclosure is attached to a living body;

FIG. 2A is an upper view of the stretchable circuit board before attachment to the living body, and FIG. 2B is a longitudinal sectional view of the stretchable circuit board illustrated in FIG. 2A from the side of arrows A, A of the figure;

FIGS. 5A to 5C are views for describing each step subsequent to those of FIG. 4 in the method for manufacturing the stretchable circuit board of the first embodiment of the present disclosure;

FIG. 6 is an upper view of a stretchable circuit board of a second embodiment of the present disclosure.

DETAILED DESCRIPTION

Figure 3A:
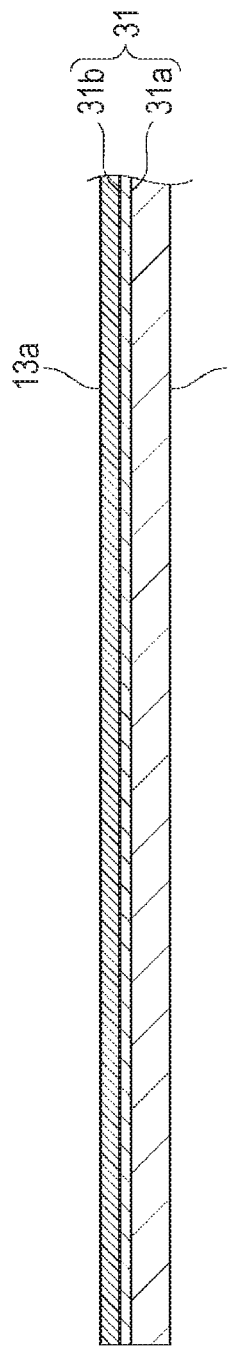
FIGS. 3A to 3D are longitudinal sectional views of each configuration of a stretchable base material illustrated in FIG. 2B, FIG. 3A illustrating the stretchable base material, FIG. 3B illustrating a stretchable cover, FIG. 3C illustrating an adhesive layer, and FIG. 3D illustrating a film base material.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

However, any of the layers forming the stretchable circuit board is a thin resin-based film, and therefore, is hard to be handled. For this reason, each layer is handled with the layer being bonded to a separator called release or process paper at the step of manufacturing the stretchable circuit board. JP-A-2017-34038 describes a configuration including the stretchable auxiliary material provided on a protection layer provided on the wiring line. At the step of manufacturing such a configuration, the protection layer bonded to the separator is stacked on the stretchable base material provided with the wiring line such that the separator is on an upper side, and then, hot pressing is performed. Subsequently, the stretchable auxiliary material bonded to the separator is stacked on the protection layer remaining after the separator has been detached such that the separator is on the upper side, and then, hot pressing is performed. Hot pressing is a relatively time-consuming step at the step of manufacturing the stretchable circuit board. Thus, an increase in the number of times of hot pressing leads to a disadvantage that a manufacturing efficiency at the entire stretchable circuit board manufacturing step is lowered. The stretchable circuit board of the present disclosure has been developed in view of the above-described points. That is, the present disclosure relates to a stretchable circuit board configured so that a high manufacturing efficiency can be obtained by reduction in wire disconnection without use of a hot pressing step and the method for manufacturing the stretchable circuit board.

A stretchable circuit board according to the present disclosure includes: a stretchable base material having stretchability; a film base material overlapping with part of a one-surface-side surface of the stretchable base material and having lower stretchability than that of the stretchable base material; a stretchable wiring line formed on the one-surface-side surface of the stretchable base material; and an adhesive layer formed on the one surface side or the other surface side of the stretchable base material. The adhesive layer is formed on both of an overlapping region where the stretchable base material overlaps with the film base material and a non-overlapping region where the stretchable base material does not overlap with the film base material.

A method for manufacturing a stretchable circuit board according to the present disclosure includes steps of: forming a stretchable wiring line on a one-surface-side surface of a stretchable base material having stretchability; forming a film base material having lower stretchability than that of the stretchable base material such that the film base material overlaps with part of the stretchable base material; and forming, on one surface side or the other surface side of the stretchable base material, an adhesive layer on both of an overlapping region where the stretchable base material overlaps with the film base material and a non-overlapping region where the stretchable base material does not overlap with the film base material.

According to the stretchable circuit board and the stretchable circuit board manufacturing method of the present disclosure, wire disconnection can be reduced without use of the hot pressing step. Thus, a high manufacturing efficiency can be obtained.

First Embodiment (Stretchable Circuit Board)

Hereinafter, a first embodiment, a second embodiment, and a third embodiment (also collectively referred to as "present embodiments") of the present disclosure will be described with reference to the drawings. Note that in all drawings, similar reference numerals are assigned to similar components. Moreover, overlapping description will be omitted as necessary. In addition, the drawings are drawings for describing configurations of the present embodiments. These drawings do not always illustrate precise and accurate lengths, thicknesses, widths, etc. Further, the present embodiments are not limited to shapes and designs included in the illustrated configurations. FIG. 1 is a perspective view of a state in which a stretchable circuit board 1 of the first embodiment is attached to a living body. In the first embodiment, an example where the stretchable circuit board 1 is attached to the body (hereinafter referred to as the "living body") of a target and is used as a sensor configured to measure a biosignal such as a muscle potential will be described. In the first embodiment, a living-body-facing side of the stretchable circuit board 1 attached to the living body will be referred to as the back (a back surface or a back side) of the stretchable circuit board 1. Moreover, the opposite side of the back will be referred to as the front (a front surface or a front side). The stretchable circuit board 1 illustrated in FIG. 1 is an upper perspective view of the stretchable circuit board 1 from the front side. FIG. 2A is an upper view of the stretchable circuit board 1 right before the stretchable circuit board 1 is attached to the living body. FIG. 2B is a longitudinal sectional view of the stretchable circuit board 1 illustrated in FIG. 2A from the side of arrows A, A of the figure.

(Entire Configuration)

The stretchable circuit board 1 illustrated in FIGS. 1, 2A, and 2B has a stretchable base material 31 having stretchability, and a film base material 53 overlapping with part of a back surface 31*b* (hereinafter merely referred to as a "back surface") of the stretchable base material 31 on one surface side and having lower stretchability than that of the stretchable base material 31. In the first embodiment, a region of the stretchable base material 31 where the stretchable base material 31 and the film base material 53 overlap with each other will be referred to as an "overlapping region 5." On the other hand, a region where the stretchable base material 31 does not overlap with the film base material 53 will be referred to as a "non-overlapping region 3." Moreover, the stretchable circuit board 1 has stretchable wiring lines 32. The stretchable wiring lines 32 are formed across the overlapping region 5 and the non-overlapping region 3. Further, the stretchable circuit board 1 includes an adhesive layer 34 formed on the back surface 31*b* of the stretchable base material 31. The adhesive layer 34 is formed on both of the overlapping region 5 and the non-overlapping region 3. In FIG. 1, the adhesive layer 34 formed on the overlapping region 5 is illustrated as an overlapping adhesive layer 34*b*. On the other hand, the adhesive layer 34 formed on the non-overlapping region 3 is illustrated as a non-overlapping adhesive layer 34*a*. Note that terms "film," "sheet," and "film" of the first embodiment generally and broadly include thinly-shaped objects. That is, a difference in term such as a sheet, a film, or a membranous object does not define the magnitude of the thickness of an individual member.

In the above-described configuration, "one surface side" of the stretchable base material 31 indicates the side of one of two main surfaces of the stretchable base material 31 as a thin film. This term does not identify any of two main surface sides. Moreover, one surface side does not indicate one main surface itself, but indicates the direction of such a main surface. A surface on one surface side indicates a surface of the stretchable base material 31 on one main surface side. A base material having "lower stretchability" than that of the stretchable base material 31 also includes a base material having substantially no stretchability. Moreover, in addition to the above-described members, the stretchable circuit board 1 includes a stretchable cover 35 and a separator 11a as illustrated in FIG. 2B. The stretchable cover 35 is a member configured to protect the stretchable wiring lines 32 on the stretchable base material 31. External terminals 51 are formed at one end portion of the overlapping region 5 of the stretchable circuit board 1. The stretchable wiring lines 32 are each connected to the external terminals 51. Electrodes 33 are connected to the other end portions of the stretchable wiring lines 32. The electrodes 33 contact, for example, the living body via conductive gel exhibiting biological safety to detect the biosignal. The separator 11a is configured to protect the stretchable base material 31 of the stretchable circuit board 1 to reduce adherence of the stretchable base material 31 exhibiting slight tackiness to an unintended member or generation of wrinkles of the stretchable base material 31. Note that a material of the separator 11a is not limited to resin and paper. As long as a member has the above-described function and is easily detachable from the stretchable base material 31, any material can be used for the member.

In the first embodiment, the adhesive layer 34 exhibiting the biological safety is, in the stretchable circuit board 1, formed on the side of the back surface 31b of the stretchable base material 31, the stretchable wiring lines 32 being formed on the back surface 31b. In the first embodiment, the stretchable circuit board 1 can be attached such that the surface on which the stretchable wiring lines 32 are formed faces a living body side. Note that the first embodiment is not limited to such a configuration. As far as the electrodes 33 can detect an electric signal from the living body, any of a front surface 31a and the back surface 31b may be attached to the living body.

In an example illustrated in FIGS. 2A and 2B, the overlapping adhesive layer 34b formed on the side of the overlapping region 5 and the non-overlapping adhesive layer 34a formed on the side of the non-overlapping region 3 are continuously formed. According to such a configuration, the non-overlapping adhesive layer 34a and the overlapping adhesive layer 34b can be simultaneously formed. Thus, the step of forming the adhesive layer can be facilitated. According to the first embodiment, when external force is generated due to holding of an external-terminal-51-side end portion of the stretchable circuit board 1 attached to the living body, the origin of the force applied to the stretchable circuit board 1 can be apart from the stretchable base material 31 or a boundary between the non-overlapping region 3 and the overlapping region 5. Thus, stretching of the stretchable base material 31 when the stretchable circuit board 1 is attached to the living body is reduced. Consequently, disconnection of the stretchable wiring lines 32 due to a difference in stretching between the non-overlapping region 3 and the overlapping region 5 can be reduced. Moreover, according to the first embodiment, the external force generated when the external-terminal-51-side end portion of the stretchable circuit board 1 attached to the living body is held is transmitted to the living body via the overlapping adhesive layer 34b. Thus, the force applied to the stretchable base material 31 can be released to the living body side. Consequently, stretching of the stretchable base material 31 is reduced. As a result, disconnection of the stretchable wiring lines 32 due to the difference in stretching between the non-overlapping region 3 and the overlapping region 5 can be reduced.

Next, each member described above will be described.

(Film Base Material)

The film base material 53 exhibits flexibility, and has a greater Young's modulus than that of the stretchable base material 31. Note that in the first embodiment, the film base material 53 having lower stretchability than that of the stretchable base material 31. That is, the film base material 53 substantially little stretches. A material of the film base material 53 is not specifically limited. Examples of the available material of the film base material 53 may include less-slidable, corrosive resistant, high-strength synthetic resin such as polyethylene terephthalate (PET), polyethylene naphthalate (PEN), polyimide (PI), polyphenylene sulfide (PPS), and fluorine resin. In addition, a paper material exhibiting, e.g., cellulose nanofiber paper equivalent durability may be used for the film base material 53.

The thickness of the film base material 53 is equal to or greater than 10 μm and equal to or less than 200 μm, preferably equal to or greater than 25 μm and equal to or less than 150 μm, and more preferably equal to or greater than 50 μm and equal to or less than 100 μm. Moreover, the thickness of the film base material 53 is preferably greater than that of the stretchable base material 31. When the thickness of the film base material 53 is within the above-described range, in-plane rigidity of a region where the external terminals 51 are formed can be sufficiently enhanced. In addition, an increase in the entire thickness of the stretchable circuit board 1 can be suppressed.

(Stretchable Base Material)

The stretchable base material 31 has higher stretchability than that of the film base material 53. Examples of a preferred material forming the stretchable base material 31 may include elastomer materials such as nitrile rubber, latex rubber, and urethane-based elastomer. Note that the above-described preferred material is not limited to these examples. Specifically, a urethane-based elastomer sheet for medical use is used so that high safety can be obtained even in the case of attachment to the skin of a human body.

The thickness of the stretchable base material 31 is not specifically limited. Note that a preferred thickness is, for example, equal to or less than 100 μm, considering prevention of interference with stretching motion of a target object (a target surface) to which the stretchable circuit board 1 is applied. The thickness of the stretchable base material 31 is more preferably equal to or less than 25 μm, and much more preferably equal to or less than 10 μm.

The maximum degree of elongation of the stretchable base material 31 is preferably equal to or higher than 10%, more preferably equal to or higher than 50%, much more preferably equal to or higher than 100%, and still much more preferably equal to or higher than 200%. The stretchable base material 31 including the above-described material can exhibit a maximum elongation degree of equal to or higher than 300%, for example. The maximum degree of elongation of the stretchable base material 31 as described herein indicates such a maximum elongation degree that elastic deformation is allowed in one direction of in-plane directions. Note that the degree of elongation in the present specification means the rate of a dimension increase due to elongation in one direction of the in-plane directions in response to force application with respect to dimensions (dimensions with an elongation degree of 0%) in the case of no external force application. For example, in a case where the degree of elongation is 50%, the dimension increase rate is 1.5 times as large as the dimensions with an elongation degree of 0%. When the degree of elongation is 100%, the dimension increase rate is twice as large as the dimensions with an elongation degree of 0%.

(Stretchable Cover)

As described above, the stretchable wiring lines 32 having stretchability are formed on the stretchable base material 31. The stretchable cover 35 covers at least part of the stretchable wiring lines 32 to protect the stretchable wiring lines 32. The stretchable cover 35 preferably includes an insulating stretchable material. For example, an elastomer material can be used for the stretchable cover 35. A resin material common to the stretchable base material 31 may be used. Thus, the stretchable wiring lines 32 can be protected without lowering of the stretchability of the stretchable base material 31. For joining the stretchable cover 35 of the first embodiment, the stretchable cover 35 produced in a sheet shape in advance is bonded to the film base material 53 and the stretchable base material 31. The thickness of the stretchable cover 35 is not specifically limited. Note that the thickness is preferably equal to or less than 100 μm, more preferably equal to or less than 50 μm, and much more preferably equal to or less than 30 μm, considering prevention of interference with stretchability of the stretchable circuit board 1.

(Stretchable Wiring Line)

The multiple external terminals 51 are formed at an end portion of the film base material 53. In the first embodiment, the external terminals 51 are directly connected to the multiple stretchable wiring lines 32 in one-to-one correspondence. The external terminals 51 and wiring portions are joined to each other by laminate connection or pressing, for example. The thickness dimension and width dimension of the stretchable wiring line 32 can be determined considering not only limitations due to a resistance change in the stretchable wiring line 32, which initially receives no load, upon stretching of the stretchable base material 31 but also limitations due to the thickness dimension and width dimension of the entirety of the stretchable circuit board 1. Considering that favorable stretchability which can follow a dimension change upon stretching of the stretchable base material 31 is ensured, the width dimension of the stretchable wiring line 32 is preferably equal to or less than 1000 μm, more preferably equal to or less than 500 μm, and much more preferably equal to or less than 200 μm. The thickness dimension of each stretchable wiring line 32 can be set to equal to or less than 25 μm. Preferably, the thickness dimension of the stretchable wiring line 32 is equal to or greater than 10 μm and equal to or less than 15 μm.

(Adhesive Layer)

Any of the non-overlapping adhesive layer 34a and the overlapping adhesive layer 34b is obtained in such a manner that die-cutting is performed for a sheet material formed by application of an adhesive by, e.g., a coating method such that the electrodes 33 are exposed. The adhesive layer 34 produced as described above is bonded to the stretchable cover 35 after having been configured as a component separated from the stretchable base material 31, the stretchable cover 35, etc. Note that the non-overlapping adhesive layer 34a and the overlapping adhesive layer 34b used in the first embodiment are not limited to the adhesive layer formed as the component separated from the stretchable base material 31 and the stretchable cover 35. An adhesive layer formed by applying the adhesive to a surface of the stretchable cover 35 after bonding of the stretchable base material 31 and the stretchable cover 35 may be used.

In the first embodiment, similar agents including similar materials may be used as the non-overlapping adhesive layer 34a and the overlapping adhesive layer 34b. The adhesive layer 34 includes resin which can exhibit adhesion to an attachment target surface right after the adhesive layer 34 has been attached to the attachment target surface. Moreover, the adhesive layer 34 can repeatedly exhibit the adhesion depending on a state of the attachment target surface. Such properties of the adhesive are different from properties of an adhesive in the form of liquid or gel before bonding and in the form of solid after drying. Moreover, in addition to the above-described "adhesive," a "gel sheet" containing an electrolyte component and exhibiting both properties of liquid and solid can be applied. This gel sheet can stably hold a constantly-wet state. The adhesive and the gel sheet preferably exhibit biological safety such that no adverse effect is provided to a living tissue typified by the skin etc. Thus, an adhesive used for a first-aid adhesive tape or a surgical tape is used for the adhesive layer 34. Examples of such an adhesive may include an acrylic-based adhesive and a rubber-based adhesive. Moreover, the non-overlapping adhesive layer 34a and the overlapping adhesive layer 34b used in the first embodiment are not limited to the similar adhesive layers. The raw materials, treatment, processing, and adhesion of these layers may be different from each other. In one example where the non-overlapping adhesive layer 34a and the overlapping adhesive layer 34b are different from each other in the adhesion, an adhesive layer exhibiting high adhesion is used for the non-overlapping adhesive layer 34a, considering that the non-overlapping adhesive layer 34a can closely contact the living body to detect the biosignal. On the other hand, an adhesive layer exhibiting less adhesion than that of the non-overlapping adhesive layer 34a is used for the overlapping adhesive layer 34b such that drag of force acting on an end portion of the overlapping adhesive layer 34b in the overlapping region 5 does not become too high.

(Method for Manufacturing Stretchable Circuit Board)

Next, the method for manufacturing the stretchable circuit board 1 described above will be described. FIGS. 3A to 5C are views for describing the method for manufacturing the stretchable circuit board 1. Any of FIGS. 3A to 3D is a longitudinal sectional view of components of the stretchable circuit board 1. Any of FIGS. 4A to 5C is a longitudinal sectional view of the stretchable circuit board 1 or the stretchable circuit board 1 in the course of manufacturing. In these sectional views, upper and lower sides are inverted from those of the longitudinal sectional view illustrated in FIG. 2B. FIG. 3A is the longitudinal sectional view of the stretchable base material 31 having the front surface 31a and the back surface 31b. A protect film 13a is bonded to a back surface 31b side of the stretchable base material 31 illustrated in FIG. 3A. Moreover, the separator 11a is bonded to a front surface 31a side. Any of the protect film 13a and the separator 11a is bonded to the stretchable base material 31 by the tackiness of the stretchable base material 31.

Figure 3B:
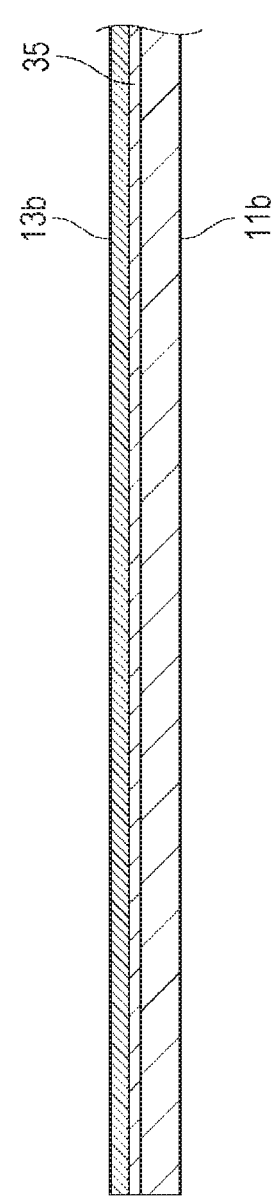
Figure 3C:
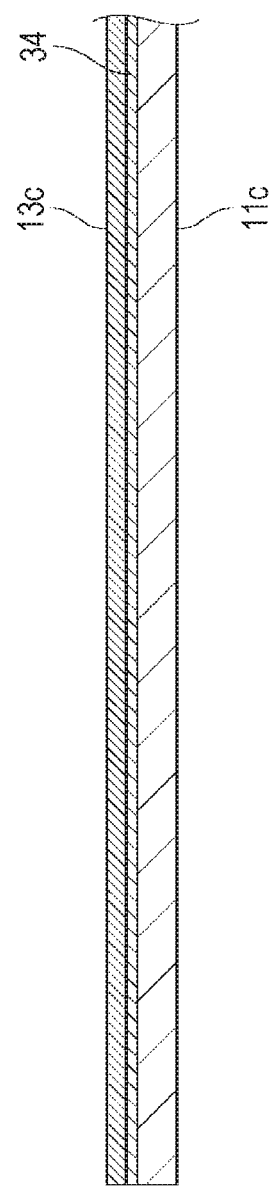
Figure 3D:
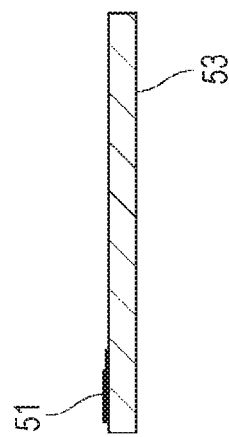

FIG. 3B is the longitudinal sectional view of the stretchable cover 35. The stretchable cover 35 is protected with the stretchable cover 35 being sandwiched between a protect film 13b and a separator 11b. FIG. 3C is the longitudinal sectional view of the adhesive layer 34. The stretchable cover 35 is protected with the stretchable cover 35 being sandwiched between a protect film 13c and a separator 11c. The protect films 13a, 13b, 13c and the separators 11a, 11b, 11c only have to prevent adhesion of the stretchable base material 31 to other objects than an intended target object and wrinkling of the stretchable base material 31, for example. Further materials of the separators 11a, 11b may be any material as long as these materials additionally withstand a thermal step upon bonding of the stretchable cover 35. Any of FIGS. 3A to 3C illustrates that the separator 11a, 11b, 11c faces downward. FIG. 3D is the longitudinal sectional view of the film base material 53 on which the external terminals 51 are formed. The film base material 53 is illustrated in a direction in which the film base material 53 is bonded to the stretchable circuit board 1 attached to the living body. The external terminals 51 are mainly formed from a coating film of carbon paste. Such a coating film exhibits surface hardness and abrasion resistance required for a connector contact point. The film base material 53 on which the external terminals 51 are formed will be also referred to as an "external lead cable." The external lead cable can be also produced by a well-known flexible printed circuit (FPC).

The method for manufacturing the stretchable circuit board of the first embodiment includes forming the stretchable wiring lines 32 on the one-surface-side back surface 31b of the stretchable base material 31 having the stretchability (a step A), forming the film base material 53 having lower stretchability than that of the stretchable base material 31 such that the film base material 53 overlaps with part of the one-surface-side back surface 31b of the stretchable base material 31 (a step B), and forming the adhesive layer on the back surface 31b side as one surface side of the stretchable base material 31 (a step C). In the first embodiment, the adhesive layer is, at the step C, formed on both of the overlapping region 5 where the stretchable base material overlaps with the film base material and the non-overlapping region 3 where the stretchable base material does not overlap with the film base material. Hereinafter, each of these steps will be specifically described.

<Step A>

Figure 4A:
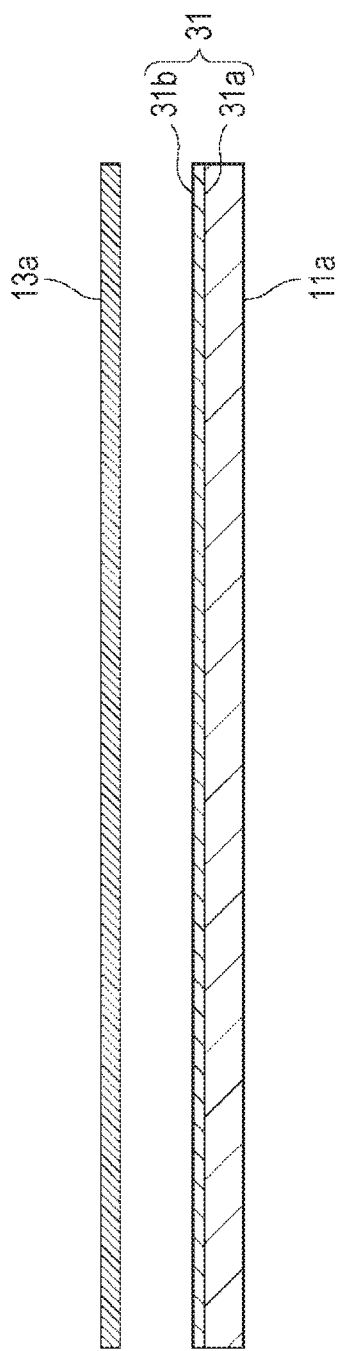
FIGS. 4A to 4C are views for describing each step of a method for manufacturing the stretchable circuit board of the first embodiment of the present disclosure.
Figure 4B:
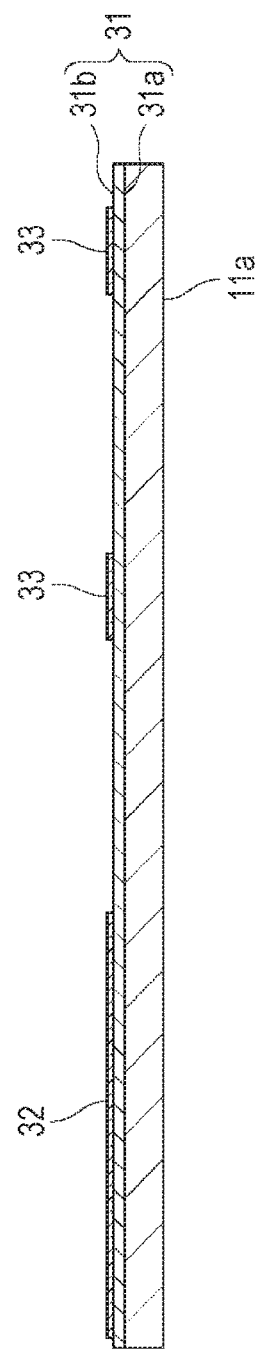

FIGS. 4A and 4B are the views for describing the step A. At the step A, the protect film 13a is, as illustrated in FIG. 4A, detached from above the back surface 31b of the stretchable base material 31 illustrated in FIG. 3A. Subsequently, the stretchable wiring lines 32 having the stretchability are formed on the back surface 31b as in FIG. 4B. In the case of forming the stretchable wiring lines 32 by printing, the electrodes 33 connected to the stretchable wiring lines 32 are formed by the same process as that of the stretchable wiring lines 32 at the step A. The electrodes 33 contact the living body to input the biosignal to the stretchable circuit board 1.

The stretchable wiring lines 32 and the electrodes 33 (hereinafter referred to as "stretchable wiring lines 32 etc.") include conductive materials, and therefore, exhibit conductivity. Examples of the conductive material included in the stretchable wiring line 32 may include a material selected from materials with favorable conductivity, such as silver, gold, platinum, carbon, copper, aluminum, cobalt, nickel, and alloy thereof. The shape of the conductive material is not specifically limited. A conductive material in a granular form or a particle form such as powder can be used. The particle form is not specifically limited. For example, a conductive material in a spherical shape, a needle shape, a flake shape, or a nanowire shape can be used. Preferably, the stretchable wiring lines 32 etc. further include a resin binder. That is, the stretchable wiring lines 32 etc. of the first embodiment are made of a conductive material including conductive particles dispersively mixed in a resin material. Since the stretchable wiring lines 32 etc. include the resin binder, the stretchable wiring lines 32 etc. become less breakable even due to stretching of the stretchable base material 31. Examples of the resin binder may include thermoplastic elastomer materials such as resin binders typified by urethane and acrylic. Note that the resin bonder is not limited to these examples. Preferably, a resin binder with a low Young's modulus is selected as the resin binder such that the elastic modulus of the stretchable wiring lines 32 etc. in the form of a coating film is equal to or lower than that of the stretchable base material 31. A single elastomer material may be used. Alternatively, a mixture of multiple elastomer materials may be used.

The method for forming the stretchable wiring lines 320 etc. is not specifically limited. For example, the stretchable wiring lines 32 etc. can be formed by a printing method. That is, the stretchable wiring lines 32 etc. of the first embodiment have a print pattern formed in such a manner that conductive paste having stretchability is printed and applied. Such a print pattern is formed through the step of drying and solidifying the conductive paste by heating of the conductive paste for a predetermined time after application of the conductive paste. A specific printing method for forming the stretchable wiring lines 32 etc. is not specifically limited. Specific examples may include a screen printing method, an inkjet printing method, a gravure printing method, and an offset printing method. Of these methods, screen printing is preferably used considering fine resolution and thick film stability. In the case of forming the stretchable wiring lines 32 etc. by the printing method, the above-described prepared conductive paste including the conductive particles, the resin binder, and an organic solvent can be provided for the printing method. Stretchable conductive paste containing metal particles such as silver as a main component can be also used for the stretchable wiring lines 32. This can realize an elongation degree of equal to or higher than about 50% and equal to or lower than about 70%, for example. Thus, a wiring line with excellent elongation properties can be formed.

<Step B>

Figure 4C:
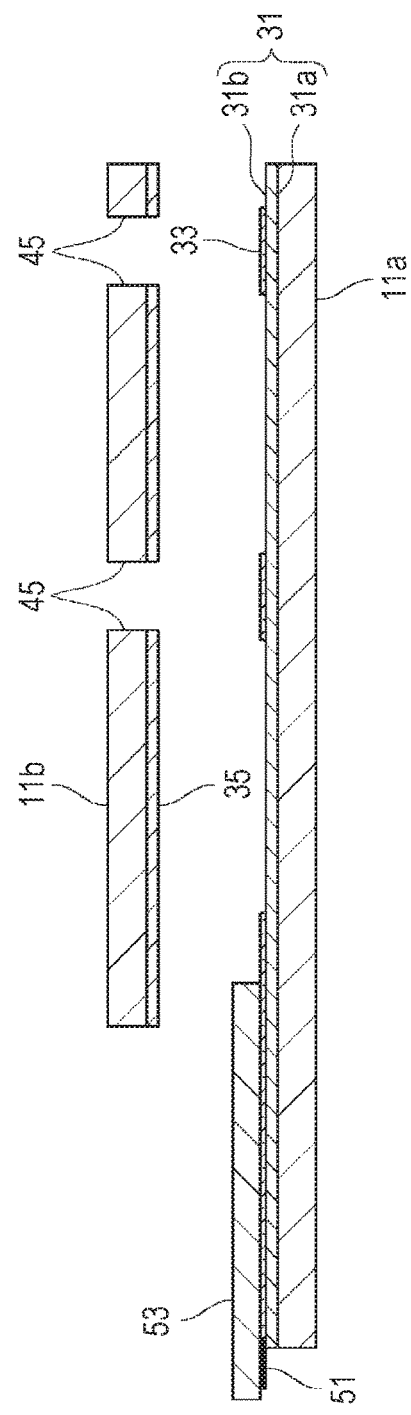

At the step B, the external lead cable and the stretchable base material 31 overlap with each other as illustrated in FIG. 4C. At this step, the film base material 53 is stacked on the stretchable base material 31 such that the external terminals 51 overlap with the stretchable wiring lines 32. A not-shown easily-adhesive layer is formed on a surface side of the film base material 53 facing the stretchable base material 31. This can hold not only adhesion between each external terminal 51 and the film base material 53, but also hold adhesive in the case of performing laminating for the stretchable base material 31 and the film base material 53.

Next, in the first embodiment, the stretchable cover 35 illustrated in FIG. 3B overlaps with the stretchable base material 31. The stretchable cover 35 is bonded to the protect film 13b (FIG. 3B) and the paper separator 11b. The stretchable cover 35 bonded to the separator 11b has openings 45 as in FIG. 4C. The openings 45 are formed such that the electrodes 33 of the stretchable wiring lines 32 as electrodes electrically contact the outside such as the living body, for example. After the protect film 13b has been detached and removed, the stretchable cover 35 and the separator 11b are, as illustrated in FIG. 4B, position-adjusted to the stretchable base material 31 and the film base material 53. The stretchable cover 35 and the separator 11b are bonded to each other by laminating. Note that laminating of the first embodiment indicates the processing of pressure-bonding the stretchable cover 35 and the stretchable base material 31 by heating and pressing via the separators 11a, 11b. The stretchable cover 35 is softened by laminating to closely contact the stretchable base material 31.

<Step C>

FIGS. 5A, 5B, and 5C are the views for describing the step C of the first embodiment. At the step C, the separator 11b is detached from the external lead cable, the stretchable base material 31, and the stretchable cover 35 subjected to laminating at the step B, as illustrated in FIG. 5A. As illustrated in FIG. 5A, the stretchable cover 35 is fused with part of the stretchable cover 35 extending over the film base material 53. Thus, a step portion S is formed by the film base material 53. Subsequently, at the step C, the protect film 13c is detached from the adhesive layer 34 illustrated in FIG. 3C to overlap with the stretchable cover 35. Then, the adhesive layer 34 is bonded to the stretchable cover 35 with the adhesive layer 34 overlapping with the stretchable cover 35. FIG. 5B illustrates the stretchable cover 35 and the adhesive layer 34 bonded to each other. Note that for the sake of convenience, FIGS. 5A to 5C illustrate that the separator 11c bends along the base step and the separator 11a and the back surface 31b are flat. However, the actual stretchable circuit board 1 is not always in this state. The shapes of the separators 11a, 11c are determined according to rigidity of the separators 11a, 11c. Subsequently, the separator 11c illustrated in FIG. 5B is detached from the adhesive layer 34 as illustrated in FIG. 5C. As in FIG. 5B, the separator 11c and the adhesive layer 34 have openings 46. The openings 46 are formed such that the electrodes 33 of the stretchable wiring lines 32 electrically contact the outside such as the living body, for example. With the openings 46, no non-overlapping adhesive layer 34a is present on the openings 46. Thus, the electrodes 33 are exposed through the non-overlapping adhesive layer 34a. As illustrated in FIGS. 5A to 5C, a portion of the adhesive layer 34 in the non-overlapping region 3 is the non-overlapping adhesive layer 34a in the first embodiment. A portion in the overlapping region 5 is the overlapping adhesive layer 34b. The stretchable circuit board 1 after detachment of the separator 11c is the stretchable circuit board 1 right before use as illustrated in FIGS. 1 and 2.

As described above, in the first embodiment, the adhesive layer is also provided in the non-overlapping region 3 and the overlapping region 5, and therefore, disconnection of the stretchable wiring lines 32 at the boundary between the non-overlapping region 3 and the overlapping region 5 can be reduced. Hot pressing is a relatively time-consuming step at the step for the stretchable wiring line. A greater number of times of hot pressing results in a lower manufacturing efficiency of the stretchable circuit board. In the above-described well-known stretchable circuit board, after the separator 11b of the stretchable cover 35 has been detached, the protection layer supported on the separator is further bonded by hot pressing. In this manner, disconnection of the stretchable wiring lines 32 at the boundary between the non-overlapping region 3 and the overlapping region 5 is reduced. On the other hand, in the first embodiment, the adhesive layer 34 is formed on both of the non-overlapping region 3 and the overlapping region 5. With this configuration, the effect of reducing disconnection of the stretchable wiring lines 32 at the boundary between the non-overlapping region 3 and the overlapping region 5 is obtained. According to the first embodiment, wire disconnection can be reduced without use of the hot press step. Thus, the stretchable circuit board and the stretchable circuit board manufacturing method can be provided with a high manufacturing efficiency.

Second Embodiment

Next, a second embodiment of the present disclosure will be described. The second embodiment is intended to reduce a slight clearance ("lifting" of an adhesive layer) between the adhesive layer and a living body in a case where the adhesive layer is formed on a step portion S illustrated in FIGS. 5A to 5C. FIG. 6 is an upper view of a stretchable circuit board 100 of the second embodiment of the present disclosure. The stretchable circuit board 100 is different from that of the first embodiment in that an overlapping adhesive layer 134b formed on the side of an overlapping region 5 and a non-overlapping adhesive layer 134a formed on the side of a non-overlapping region 3 are separately formed. That is, the adhesive layer 34 of the first embodiment is, as illustrated in FIGS. 2A and 2B, a continuous member formed across the non-overlapping region 3 and the overlapping region 5. However, in the second embodiment, the overlapping adhesive layer 134b is, only in the overlapping region 5, formed apart from a boundary between the non-overlapping region 3 and the overlapping region 5. According to the second embodiment, lifting of the adhesive layer from the living body due to a step formed at the boundary between the non-overlapping region 3 and the overlapping region 5 and expansion of lifting of the non-overlapping adhesive layer 134a and the overlapping adhesive layer 134b from an end portion can be prevented. According to the second embodiment without lifting of the adhesive layer, the stretchable circuit board 100 more fits to the living body than that of the first embodiment, and therefore, force on a stretchable base material 31 can be transmitted to a living body surface and be released. According to the second embodiment, force on the overlapping region 5 can be more efficiently released via the living body surface as compared to the first embodiment. As a result, excessive stretching of the stretchable base material 31 due to the applied force can be reduced.

Moreover, in the method for manufacturing the stretchable circuit board of the second embodiment, the adhesive layer is formed on other portions than a portion corresponding to a predetermined region including the boundary between the overlapping region 5 and the non-overlapping region 3. In this manner, the stretchable circuit board 100 can be manufactured. The "predetermined region including the boundary between the overlapping region 5 and the non-overlapping region 3" as described herein indicates an area including the boundary and the periphery thereof. The size of this region is not specifically limited. However, note that the size of the predetermined region is limited to a certain range so that the region may not prohibit the non-overlapping adhesive layer 134a from having an equal to or larger than the size that enables the layer 134a to detect a high-quality biosignal when the stretchable base material 31 closely contacts the living body. Further, the size of the predetermined region is limited to a certain range so that the region may not prohibit the overlapping adhesive layer 134b from having an equal to or larger than the size that enables the layer 134b to transmit the force to the living body.

Third Embodiment

Figure 7A:
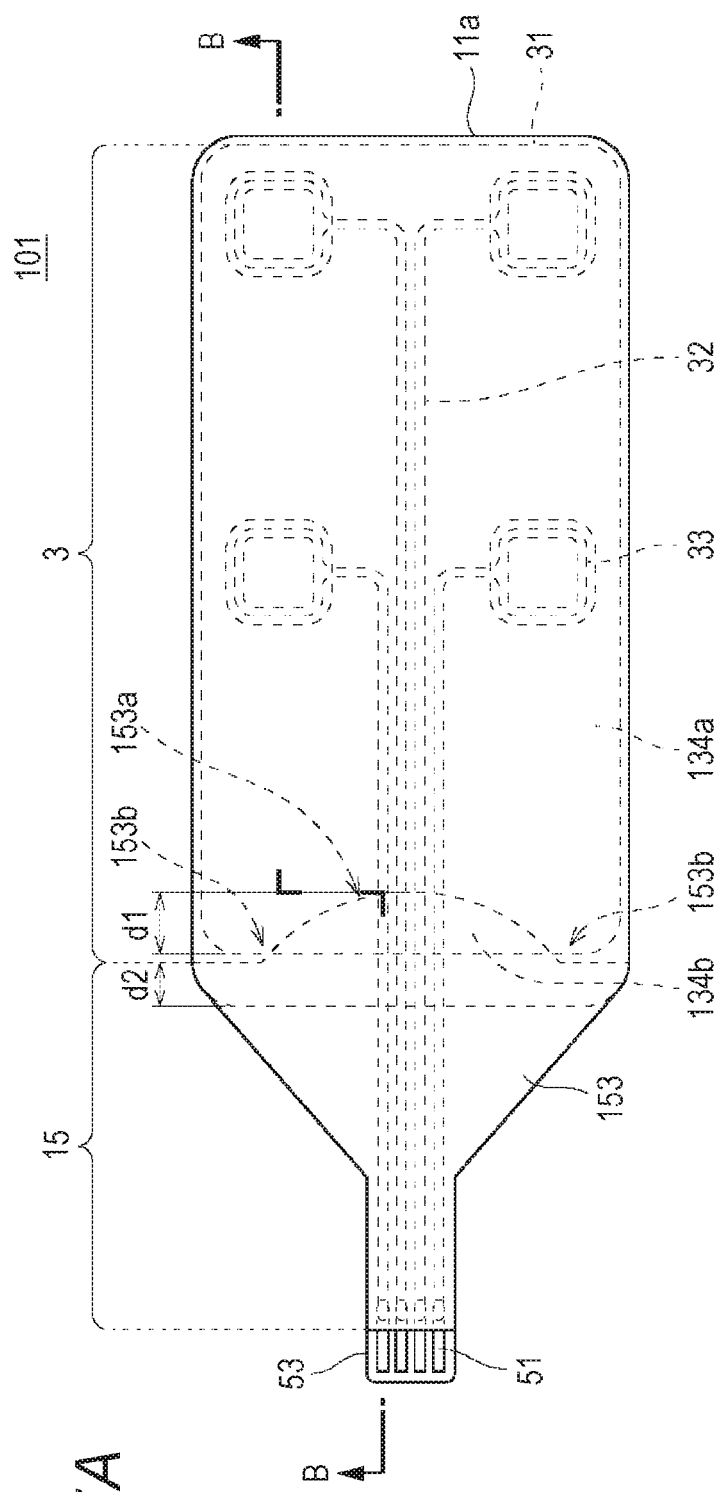
FIG. 7A is an upper view of a stretchable circuit board of a third embodiment.
Figure 7B:
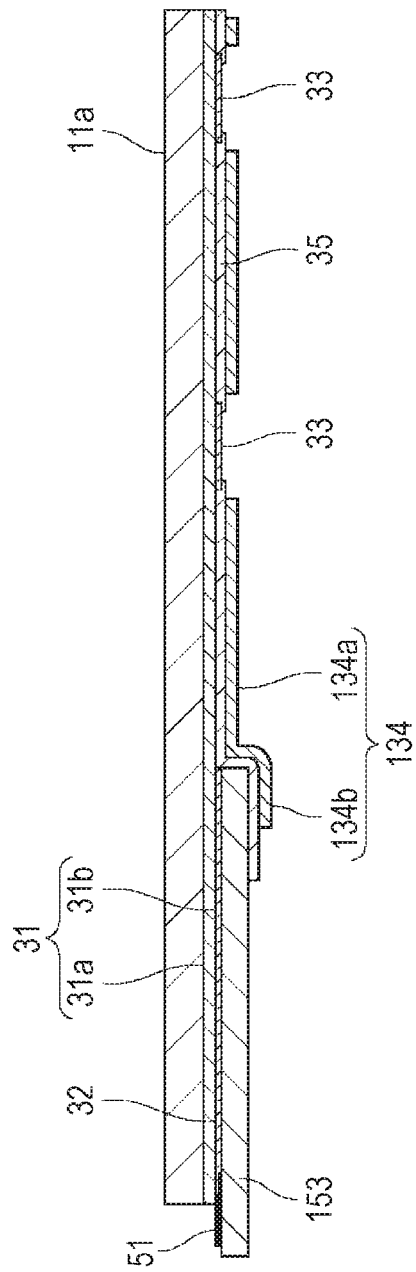
FIG. 7B is a longitudinal sectional view of the stretchable circuit board from the side of arrows B, B of FIG. 7A.

Next, a third embodiment of the present disclosure will be described. The third embodiment is intended to maintain a substantial external lead cable length in the first and second embodiments even when an overlapping region is attached to a living body. FIG. 7A is an upper view of a stretchable circuit board 101 of the third embodiment. FIG. 7B is a longitudinal sectional view of the stretchable circuit board from the side of arrows B, B illustrated in FIG. 7A. The stretchable circuit board 101 of the third embodiment is different from those of the first and second embodiments in that a protruding portion 153a is formed at part of an end portion, facing a non-overlapping region 3, of a film base material 153 overlapping with a stretchable base material 31. The protruding portion 153a protrudes toward the non-overlapping region 3 with respect to non-protruding portions 153b as other portions of an end portion than the protruding portion 153a. In the third embodiment, an overlapping region 15 protrudes toward the non-overlapping region 3 as illustrated in FIGS. 7A and 7B. In the third embodiment, an adhesive layer 134 can be formed in the same area as that of a well-known adhesive layer formed only on the side of the non-overlapping region 3. In addition, an overlapping adhesive layer 134b can be provided not only on the non-overlapping region 3 but also on the film base material 153. Thus, the third embodiment can ensure the same external lead cable length as that of the well-known stretchable circuit board while providing the stretchable circuit board 101 having the overlapping adhesive layer 134b.

In the stretchable circuit board 101 illustrated in FIGS. 7A and 7B, the non-protruding portions 153b of the film base material 153 overlapping with the stretchable base material 31 are formed to sandwich the protruding portion 153a in a width direction of the non-overlapping region 3. For ensuring the external lead cable length, the maximum length d1 from a boundary between the overlapping region 15 and the non-overlapping region 3 to the end portion of the protruding portion 153a is, in the third embodiment, equal to or greater than a length d2 from the boundary between the overlapping region 15 and the non-overlapping region 3 to an end portion of the overlapping region 15, for example. With this configuration, the external lead cable length substantially shortened due to the overlapping adhesive layer 134b can be recovered. Moreover, the protruding portion 153a and the non-protruding portions 153b of the third embodiment are, at the end portions thereof, in a curved shape (an arc shape). According to the third embodiment, force on the end portions of the protruding portion 153a and the non-protruding portions 153b is dispersed. Thus, the end portions are less detachable. Moreover, the stretchable circuit board 101 illustrated in FIGS. 7A and 7B includes stretchable wiring lines 32 formed in a region including a peak of the protruding portion 153a. With this configuration, the length of the protruding portion 153a can be used to the maximum extent to ensure the external lead cable length according to the stretchable circuit board 101 of the third embodiment.

Note that the third embodiment is not limited to such a configuration. The protruding portion 153a may protrude at each end of the non-overlapping region 3 in the width direction thereof. As described above, in the configuration including the protruding portion 153a formed at the end portion, force on an external lead cable is transmitted to other portions than a formation region of the stretchable wiring lines 32. Thus, stretching of the stretchable base material 31 can be reduced. Consequently, disconnection at the boundary between the non-overlapping region 3 and the overlapping region 15 can be reduced. Moreover, the length d2 may be longer than the length d1. In this case, in the third embodiment, the external lead cable longer than a well-known stretchable circuit board can be used. As a result, the process of connecting the external lead cable can be facilitated. Further, even in a case where the length d2 is shorter than the length d1, substantial shortening of the external lead cable length due to the overlapping adhesive layer 134b can be suppressed. In addition, the end portions of the protruding portion 153a and the non-protruding portions 153b may be in the shape of an arc larger or smaller than the illustrated arc. Moreover, the protruding portion 153a and the non-protruding portions 153b having the end portions in other curved shapes may be formed. Alternatively, the protruding portion 153a and the non-protruding portions 153b having linear end portions may be formed.

The above-described embodiments of the stretchable circuit board of the present disclosure are not limited to the first to third embodiments. As long as the objectives of the present embodiments are accomplished, embodiments to which various changes and modifications are made are also included in the embodiments of the present disclosure. For example, various components of the stretchable circuit board of the present disclosure are not necessarily present independently. For example, formation of multiple components as a single member, formation of a single component from multiple members, formation of part of other components by a certain component, and overlapping between part of a certain component and part of other components are allowed.

The above-described embodiments and examples include the following technical ideas:

(1) A stretchable circuit board including a stretchable base material having stretchability, a film base material overlapping with part of a one-surface-side surface of the stretchable base material and having lower stretchability than that of the stretchable base material, a stretchable wiring line formed on the surface of the stretchable base material, and an adhesive layer formed on the one surface side or the other surface side of the stretchable base material, the adhesive layer being formed on both of an overlapping region where the stretchable base material overlaps with the film base material and a non-overlapping region not overlapping with the film base material.

(2) The stretchable circuit board of (1), the adhesive layer being formed on the one surface side of the stretchable base material.

(3) The stretchable circuit board of (1) or (2), the adhesive layer formed on the side of the overlapping region and the adhesive layer formed on the side of the non-overlapping region being continuously formed.

(4) The stretchable circuit board of (1) or (2), the adhesive layer formed on the side of the overlapping region and the adhesive layer formed on the side of the non-overlapping region being separately formed.

(5) The stretchable circuit board of any one of (1) to (4), part of an end portion facing the non-overlapping region in the film base material overlapping with the stretchable base material being a protruding portion protruding toward the non-overlapping region.

(6) The stretchable circuit board manufacturing method including the step of forming a stretchable wiring line on a one-surface-side surface of a stretchable base material having stretchability, the step of forming a film base material having lower stretchability than that of the stretchable base material such that the film base material overlaps with part of the stretchable base material, and the step of forming, on the one surface side or the other surface side of the stretchable base material, an adhesive layer on both of an overlapping region where the stretchable base material overlaps with the film base material and a non-overlapping region not overlapping with the film base material.

(7) The stretchable circuit board manufacturing method of (6), the step of forming the adhesive layer including forming the adhesive layer on other portions than a portion corresponding to a predetermined region including a boundary between the overlapping region and the non-overlapping region.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A stretchable circuit board comprising:
   a stretchable base material having stretchability;
   a film base material overlapping with part of a one-surface-side surface of the stretchable base material and having lower stretchability than that of the stretchable base material;
   a stretchable wiring line formed on the one-surface-side surface of the stretchable base material; and
   an adhesive layer formed on the one surface side or the other surface side of the stretchable base material,
   wherein the adhesive layer is formed on both of an overlapping region where the stretchable base material overlaps with the film base material and a non-overlapping region where the stretchable base material does not overlap with the film base material.

2. The stretchable circuit board according to claim 1, wherein
   the adhesive layer is formed on the one surface side of the stretchable base material.

3. The stretchable circuit board according to claim 1, wherein
   the adhesive layer formed on the overlapping region and the adhesive layer formed on the non-overlapping region are continuously formed.

4. The stretchable circuit board according to claim 2, wherein
   the adhesive layer formed on the overlapping region and the adhesive layer formed on the non-overlapping region are continuously formed.

5. The stretchable circuit board according to claim 1, wherein
   the adhesive layer formed on the overlapping region and the adhesive layer formed on the non-overlapping region are separately formed.

6. The stretchable circuit board according to claim 2, wherein
   the adhesive layer formed on the overlapping region and the adhesive layer formed on the non-overlapping region are separately formed.

7. The stretchable circuit board according to claim 1, wherein
   of the film base material, part of an end portion facing the non-overlapping region is provided with a protruding portion protruding toward the non-overlapping region.

8. The stretchable circuit board according to claim 2, wherein
   of the film base material, part of an end portion facing the non-overlapping region is provided with a protruding portion protruding toward the non-overlapping region.

9. The stretchable circuit board according to claim 3, wherein
   of the film base material, part of an end portion facing the non-overlapping region is provided with a protruding portion protruding toward the non-overlapping region.

10. The stretchable circuit board according to claim 4, wherein
    of the film base material, part of an end portion facing the non-overlapping region is provided with a protruding portion protruding toward the non-overlapping region.

11. The stretchable circuit board according to claim 5, wherein
    of the film base material, part of an end portion facing the non-overlapping region is provided with a protruding portion protruding toward the non-overlapping region.

12. The stretchable circuit board according to claim 6, wherein
    of the film base material, part of an end portion facing the non-overlapping region is provided with a protruding portion protruding toward the non-overlapping region.

13. A method for manufacturing a stretchable circuit board, comprising steps of:
    A) forming a stretchable wiring line on a one-surface-side surface of a stretchable base material having stretchability;
    B) forming a film base material having lower stretchability than that of the stretchable base material such that the film base material overlaps with part of the stretchable base material; and
    C) forming, on the one surface side or the other surface side of the stretchable base material, an adhesive layer on both of an overlapping region where the stretchable base material overlaps with the film base material and a non-overlapping region where the stretchable base material does not overlap with the film base material.

14. The stretchable circuit board manufacturing method according to claim 13, wherein
    the step C) includes forming the adhesive layer on other portions than a portion corresponding to a predetermined region including a boundary between the overlapping region and the non-overlapping region.

* * * * *